(12) United States Patent
Morimoto et al.

(10) Patent No.: US 7,399,951 B2
(45) Date of Patent: Jul. 15, 2008

(54) SOLID-STATE IMAGE-SENSING DEVICE

(75) Inventors: Takashi Morimoto, Suita (JP); Tomokazu Kakumoto, Nagaokakyo (JP)

(73) Assignee: Konica Minolta Holdings, Inc., Tokyo (JP)

( * ) Notice: Subject to any disclaimer, the term of this patent is extended or adjusted under 35 U.S.C. 154(b) by 0 days.

(21) Appl. No.: 11/392,982

(22) Filed: Mar. 28, 2006

(65) Prior Publication Data

US 2006/0219868 A1    Oct. 5, 2006

(30) Foreign Application Priority Data

Mar. 29, 2005    (JP) ............... 2005-095347

(51) Int. Cl.
*H01L 27/00* (2006.01)
*H01L 31/062* (2006.01)
*G01J 1/44* (2006.01)

(52) U.S. Cl. ............... 250/208.1; 250/214 R; 257/292; 348/308

(58) Field of Classification Search ............ 250/208.1, 250/214 A, 214 R, 214.1; 348/300, 308, 348/301, 310; 257/215, 443, 448, 238, 291, 257/292; 438/75, 60, 73, 48

See application file for complete search history.

(56) References Cited

U.S. PATENT DOCUMENTS

| 6,784,015 B2 * | 8/2004 | Hatano et al. ............ 438/75 |
| 2004/0218078 A1 * | 11/2004 | Lee ............ 348/308 |

FOREIGN PATENT DOCUMENTS

| JP | 11-313257 A | 11/1999 |
| JP | 2002-77733 A | 3/2002 |
| JP | 2002-300476 A | 10/2002 |

* cited by examiner

*Primary Examiner*—Georgia Y. Epps
*Assistant Examiner*—Don Williams
(74) *Attorney, Agent, or Firm*—Sidley Austin LLP

(57) ABSTRACT

In a solid-state image-sensing device, by global shuttering, whereby image sensing is performed simultaneously in all the pixels, a potential commensurate with the amount of light incident on a buried diode PD is held in an N-type floating diffusion region FD. Then a noise signal is outputted, and then the potential held in the N-type floating diffusion region FD is transferred to an N-type floating diffusion region FD1 so that an image signal is outputted.

11 Claims, 11 Drawing Sheets

SOLID-STATE IMAGE-SENSING DEVICE

This application is based on Japanese Patent Application No. 2005-095347 filed on Mar. 29, 2005, the contents of which are hereby incorporated by reference.

BACKGROUND OF THE INVENTION

1. Field of the Invention

The present invention relates to a solid-state image-sensing device provided with pixels that output electrical signals according to incident light, and more particularly to a solid-state image-sensing device whose pixels are each composed of transistors.

2. Description of Related Art

Finding many uses, solid-state image-sensing devices are largely classified into a CCD type and a CMOS type according to the means they use to read photoelectric charges produced by photoelectric conversion elements. In a CCD-type solid-state image-sensing device, photoelectric charges are transferred while being accumulated in potential wells. This leads to a disadvantageously narrow dynamic range. On the other hand, in a CMOS-type solid-state image-sensing device, photoelectric charges accumulated in the pn-junction capacitance of photodiodes are directly read out via MOS transistors.

Some conventional CMOS-type solid-state image-sensing devices operate logarithmically by logarithmically converting the amount of incident light (see JP-A-H11-313257). These solid-state image-sensing devices offer wide, namely five- to six-digit, dynamic ranges, and thus permit, even when a subject having a slightly wider-than-usual brightness distribution is shot, all the brightness information within the brightness distribution to be converted into electrical signals for output. This, however, makes the shootable brightness range wider relative to the brightness distribution of the subject, and thus creates, in low-brightness and high-brightness regions within the shootable brightness range, regions where no brightness data is available.

Under this background, the applicant of the present invention once proposed a CMOS-type solid-state image-sensing device that can be switched between linear and logarithmic conversion as described above (see JP-A-2002-077733). The applicant of the present invention also once proposed a CMOS-type solid-state image-sensing device in which, for the purpose of automatically performing such switching between linear and logarithmic conversion, the transistors connected to photodiodes that perform photoelectric conversion are brought into a proper potential state (see JP-A-2002-300476). In this solid-state image-sensing device, by changing the potential state of those transistors, the inflection point across which their photoelectric conversion switches from linear to logarithmic conversion or vice versa can be changed.

Some other conventional solid-state image-sensing devices are provided with pixels employing a buried photodiode PD as shown in FIG. 11. The pixel shown in FIG. 11 is provided with: a buried photodiode PD formed by forming a P-type well layer 21 on a P-type substrate 20, then forming a P-type layer 10 in the surface of the P-type well layer 21 so as to bury an N-type buried layer 11; a transfer gate TG formed by forming, on the surface of a region adjacent to the region where the buried photodiode PD is formed, a gate electrode 13 with an insulating film 12 laid in between; and an N-type floating diffusion region FD formed in a region adjacent to the region where the transfer gate TG is formed.

In the thus structured pixel shown in FIG. 11, the gate voltage at the gate electrode 13 determines the potential state at the transfer gate TG, and, by using this voltage as the inflection point voltage, it is possible to switch between linear conversion, whereby an electrical signal is produced that varies linearly with respect to the amount of incident light, and logarithmical conversion, whereby an electrical signal is produced that varies logarithmically with respect to the amount of incident light. Here, the potential states of the buried photodiode PD, the transfer gate TG, and the N-type floating diffusion region FD in the pixel have a relationship as shown in FIG. 12A.

When the buried photodiode PD receives light, it produces a photoelectric charge. As a result, according to the produced photoelectric charge, the potential at the buried photodiode PD rises. Here, when the brightness of the subject is low, the charge at the buried photodiode PD is linearly proportional to the integral of the amount of incident light. On the other hand, when the brightness of the subject is high, as the potential at the buried photodiode PD rises and its difference from the potential at the transfer gate TG becomes close to a threshold level, the transfer gate TG starts to operate in a subthreshold region, causing a current to flow out of the buried photodiode PD. Now, as shown in FIG. 12A, the potential at the buried photodiode PD so varies as to be proportional to the logarithm of the current produced by photoelectric conversion.

After the potential at the buried photodiode PD has changed in this way according to the amount of incident light, the gate voltage of the gate electrode 13 is lowered to raise the potential at the transfer gate TG as shown in FIG. 12B. In this state, the charge at the buried photodiode PD is held as shown in FIG. 12B. Subsequently, the charge held in the buried photodiode PD is transferred via the transfer gate TG to the N-type floating diffusion region FD, and an electrical signal based on the thus transferred charge is outputted as an image signal.

In the solid-state image-sensing device operating as described above, global exposure, whereby image sensing is performed simultaneously in all the pixels, is achieved by global shuttering or global resetting. In global shuttering, the accumulation of an electric charge in the buried photodiode PD as described above is performed for the same period in all the pixels, and then, with the same timing, the potential at the transfer gate TG is lowered so that the photoelectric charge accumulated in the buried photodiode PD is transferred to the N-type floating diffusion region FD. After the photoelectric charge obtained by performing image sensing in all the pixels is transferred pixel by pixel to the N-type floating diffusion region FD in this way, an image signal commensurate with the thus transferred photoelectric charge is outputted pixel by pixel.

On the other hand, in global resetting, a mechanical shutter is used as mechanically light-shielding means; that is, the period for which all the pixels are exposed to light is determined by the period for which the mechanical shutter is kept open. When the mechanical shutter is closed so that practically no more photoelectric charge is accumulated in the buried photodiode PD, the N-type floating diffusion region FD is reset pixel by pixel so that a noise signal commensurate with the reset level of the N-type floating diffusion region FD is outputted. Subsequently, via the transfer gate TG, the photoelectric charge accumulated in the buried photodiode PD is transferred to the N-type floating diffusion region FD, and then an image signal commensurate with the photoelectric charge accumulated in the pixel during image sensing is outputted pixel by pixel.

Certainly, global shuttering does not require the provision of mechanically light-shielding means as required by global resetting. In global shuttering, however, the noise signal commensurate with the reset level obtained when the N-type floating diffusion region FD is reset is read out after the image signal is read out, and this makes it impossible to completely eliminate kTC noise contained in the image signal. By contrast, in global resetting, first the noise signal is outputted and then the photoelectric charge is transferred to the N-type floating diffusion region FD so that the image signal is outputted, and thus, certainly, global resetting permits elimination of kTC noise. Global resetting, however, requires extra provision of mechanically light-shielding means, such as a mechanical shutter.

Moreover, in a solid-state image-sensing device provided with pixels that perform logarithmic conversion, if it is not provided with integrating circuits, no electric charge can be accumulated, and therefore the amount of electric charge commensurate with the amount of light at the very moment that the photoelectric charge is held is held in the buried photodiode PD. Thus, if global resetting is used to eliminate kTC noise, a discrepancy between the timing with which the mechanically light-shielding means shields light and the timing with which the photoelectric charge is held in the buried photodiode PD makes it impossible to hold the photoelectric charge converted logarithmically with respect to the amount of incident light, and thus makes it impossible to read out an image signal commensurate with the amount of incident light during image sensing.

SUMMARY OF THE INVENTION

In view of the conventionally encountered inconveniences discussed above, it is an object of the present invention to provide a solid-state image-sensing device that performs photoelectric conversion in such a way as to output an electrical signal converted logarithmically with respect to the amount of incident light and that permits elimination of kTC noise when image sensing is performed by global shuttering.

To achieve the above object, according to the present invention, a solid-state image-sensing device is provided with a plurality of pixels, of which each is provided with: a buried photodiode that produces a photoelectric charge commensurate with the amount of incident light and that accumulates the photoelectric charge within itself; a first transfer gate that transfers the electric charge accumulated in the buried photodiode; a first floating diffusion region that accumulates the electric charge transferred via the first transfer gate from the buried photodiode; a second transfer gate that transfers the electric charge accumulated in the first floating diffusion region; and a second floating diffusion region that accumulates the electric charge transferred via the second transfer gate from the first floating diffusion region. Here, in each pixel, the buried photodiode, the first and second transfer gates, and the first floating diffusion region together constitute a photoelectric conversion portion. Moreover, all the pixels perform image sensing simultaneously in the respective photoelectric conversion portions with the result that: simultaneously in all the pixels, the electric charge commensurate with the amount of light incident on the buried photodiode is held in the first floating diffusion region; then, in each pixel, a noise signal commensurate with the initial state of the second floating region is outputted; and then the electric charge held in the first floating diffusion region is transferred to the second floating diffusion region, and an image signal commensurate with the amount of the thus transferred electric charge is outputted.

According to the present invention, when image sensing is performed in the photoelectric conversion portion, the electric charge produced to be commensurate with the amount of incident light is held in the first floating diffusion region, and thus the charge in the logarithmic conversion region, where no electric charge can be accumulated, can be held in the first floating diffusion region. On the other hand, to read out an image signal, first a noise signal obtained when the second floating diffusion region is reset is outputted, and then the charge held in the first floating diffusion region is transferred to the second floating diffusion region. This makes it possible to eliminate kTC noise resulting from, among others, resetting. In this way, it is possible to perform exposure simultaneously in all the pixels, moreover to adopt image sensing by global shuttering, which does not require a mechanical shutter, and moreover to hold the charge immediately after exposure.

DETAILED DESCRIPTION OF PREFERRED EMBODIMENTS

Configuration of a Solid-State Image-Sensing Device

Figure 1:
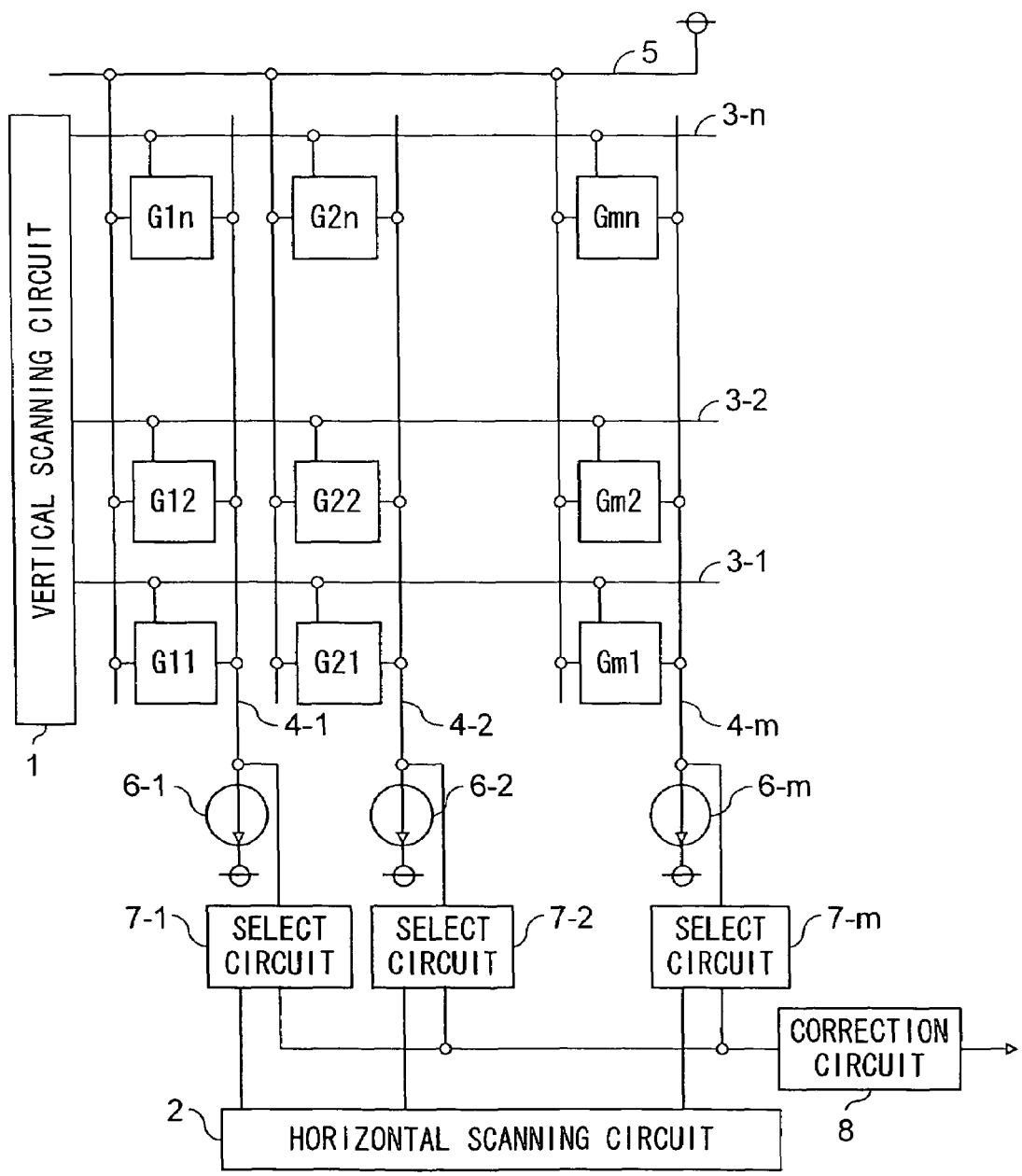
FIG. 1 is a block diagram showing the configuration of a solid-state image-sensing device embodying the present invention.

First, a solid-state image-sensing device embodying the present invention will be described with reference to FIG. 1. FIG. 1 shows an outline of the configuration of part of a two-dimensional MOS-type solid-state image-sensing device embodying the present invention.

In FIG. 1, reference symbols G11 to Gmn represent pixels arrayed in rows and columns (arrayed in a matrix). Reference numeral 1 represents a vertical scanning circuit that sequentially scans rows (lines) 3-1, 3-2, . . . , and 3-$n$ via which a signal φV is fed to the individual pixels. Reference numeral 2 represents a horizontal scanning circuit that sequentially reads out, pixel by pixel in the horizontal direction, photoelectric conversion signals delivered from the pixels to output signal lines 4-1, 4-2, . . . , and 4-$m$. Reference numeral 5 represents a supply voltage line. In reality, the pixels are connected not only to the lines 3-1 to 3-n, the output signal lines 4-1 to 4-m, and the supply power line 5 mentioned above but also to other lines (for example, clock lines and bias feed lines); these other lines, however, are omitted in FIG. 1.

To the output signal lines 4-1 to 4-m, constant current sources 6-1 to 6-m are connected respectively. Moreover, the output signal lines 4-1 to 4-m are provided with select circuits 7-1 to 7-m respectively, which sample-and-hold image signals and noise signals fed via the output signal lines 4-1 to 4-m from the pixels G11 to Gmn. When the image signals and noise signals are sequentially fed from the select circuit 7-1 to 7-m to a correction circuit 8, the correction circuit 8 corrects them to feed out image signals having noise eliminated therefrom. To one end of each of the constant current sources 6-1 to 6-m, a direct-current voltage VPS is applied.

In this solid-state image-sensing device, the output from the pixel Gab (where "a" is a natural number fulfilling 1≦a≦m and "b" is a natural number fulfilling 1≦b≦m), more specifically an image signal and a noise signal therefrom, is outputted via the output signal line 4-a, and is amplified by the amplifier that consists of the constant current source 6-a and the circuit in the pixel Gab. The image signal and the noise signal outputted from the pixel Gab are sequentially fed to the select circuit 7-a, which then samples-and-holds the image signal and the noise signal thus fed thereto.

Subsequently, the image signal sampled-and-held in the select circuit 7-a is fed to the correction circuit 8, and then the noise signal sampled-and-held in the select circuit 7-a is fed to the correction circuit 8. The correction circuit 8 corrects the image signal fed from the select circuit 7-a according to the noise signal fed from the select circuit 7-a, and then feeds out an image signal having noise eliminated therefrom. The select circuits 7-1 to 7-m and the correction circuit 8 are specifically configured, for example, as proposed in JP-A-2001-223948, which is a previous application by the applicant of the present invention. The correction circuit may be provided at where the select circuits 7-1 to 7-m are provided.

Configuration of the Pixel

Figure 2:
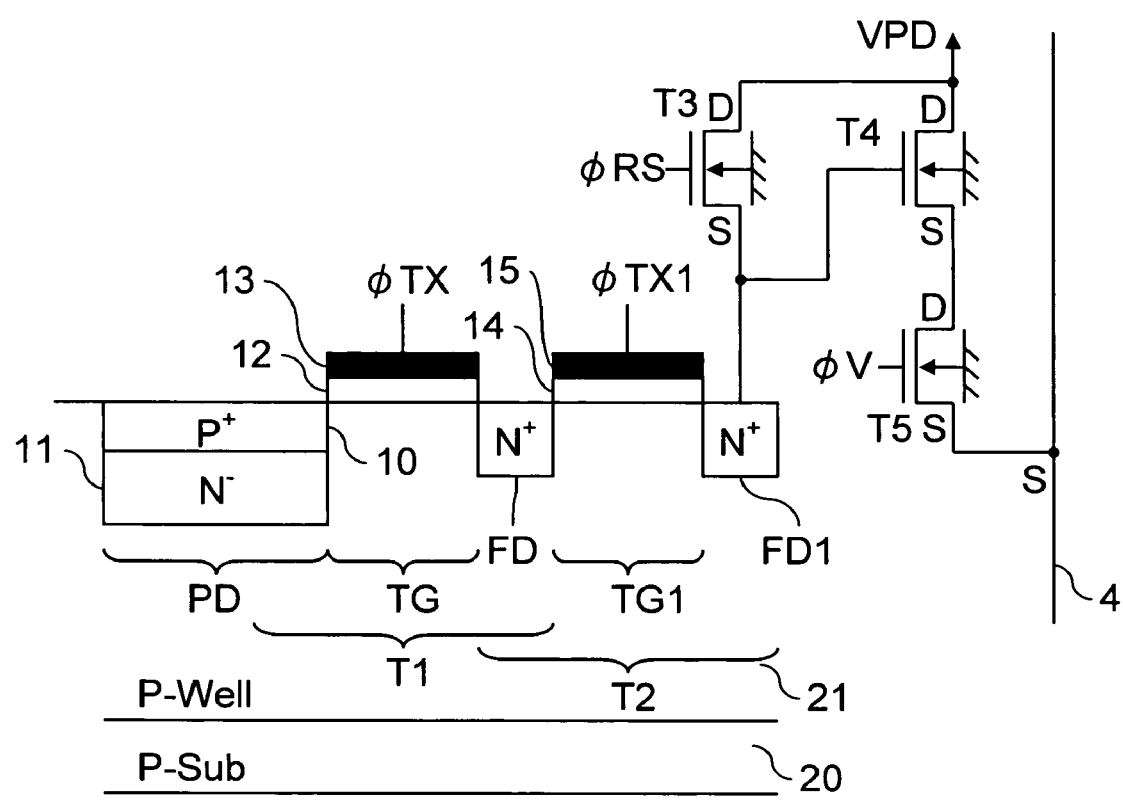
FIG. 2 is a block diagram showing the configuration of each pixel provided in the solid-state image-sensing device shown in FIG. 1.

Next, the configuration of each pixel provided in the solid-state image-sensing device configured as shown in FIG. 1 will be described with reference to FIG. 2. FIG. 2 is a diagram showing an outline of the configuration of the pixel, illustrating the relationship among the individual elements constituting it. In FIG. 2, such parts and elements as are found also in the pixel configuration shown in FIG. 11 are identified with common reference numerals and symbols, and no detailed description thereof will be repeated.

Figure 11:
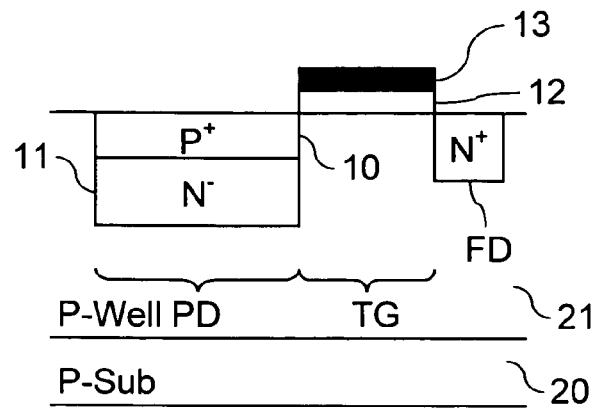
FIG. 11 is a block diagram showing the configuration of each pixel provided in a conventional solid-state image-sensing device.
Figure 12A:
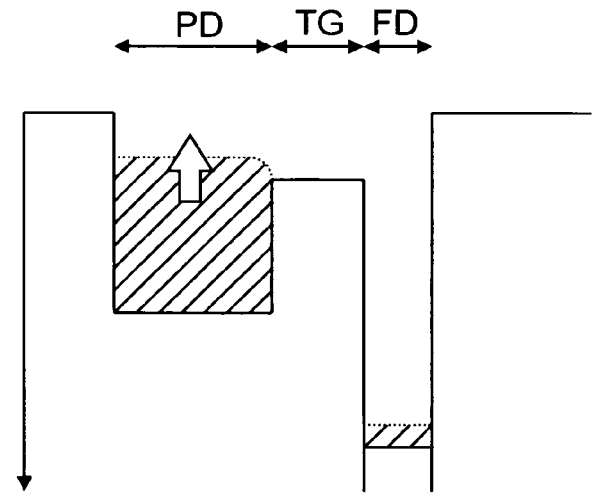
FIGS. 12A and 12B are diagrams showing the potential states of individual channels in the pixel shown in FIG. 11.
Figure 12B:
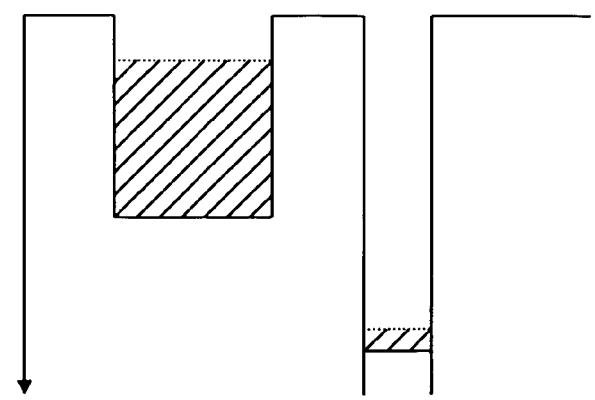

In the pixel shown in FIG. 2, there are provided a buried photodiode PD, a transfer gate TG, and an N-type floating diffusion region FD, all structured just as in FIG. 11. In addition, there are further provided: a transfer gate TG1 that transfers the photoelectric charge accumulated in the N-type floating diffusion region FD; and an N-type floating diffusion region FD1 that accumulates the photoelectric charge transferred from the transfer gate TG1. Thus, the pixel as a whole is provided with: a buried photodiode PD that is composed of a P-type well layer 21, a P-type layer 10, and an N-type buried layer 11; a transfer gate TG provided with a gate electrode 13 formed, with an insulating film 12 laid in between, on the surface of a region adjacent to the region in which the buried photodiode PD is formed; an N-type floating diffusion region FD that is formed in a region adjacent to the region where the transfer gate TG is formed; a transfer gate TG1 provided with a gate electrode 15 formed, with an insulating film 14 laid in between, on the surface of a region adjacent to the N-type floating diffusion region FD; and an N-type floating diffusion region FD1 that is formed in a region adjacent to the region where the transfer gate TG1 is formed.

Here, in the buried photodiode PD, a high-density P-type layer 10 is formed on the surface of the N-type buried layer 11. The N-type buried layer 11, the N-type floating diffusion region FD, and the transfer gate TG together constitute an N-channel MOS transistor T1. The N-type floating diffusion regions FD and FD1 and the transfer gate TG1 together constitute an N-channel MOS transistor T2. As a result of the buried photodiode PD being formed within the pixel in this way, the potential at the surface of the P-type layer 10, which belongs to the buried photodiode PD, is kept constant at the same potential as the channel stopper layer formed by the part of the P-type layer surrounding the buried photodiode PD.

Moreover, in the pixel shown in FIG. 2, there are further provided: an N-channel MOS transistor T3 that has the source thereof connected to the N-type floating diffusion region FD1 and that has a direct-current voltage VPD applied to the drain thereof; an N-channel MOS transistor T4 that has the gate thereof connected to the source of the MOS transistor T3 and that has the direct-current voltage VPD applied to the drain thereof; and an N-channel MOS transistor T5 that has the drain thereof connected to the source of the MOS transistor T4 and whose source is connected to the output signal line 4. The transfer gate TG, the transfer gate TG1, the gate of the MOS transistor T3, and the gate of the MOS transistor T5 receive signals φTX, φTX1, φRS, and φV respectively.

EXAMPLE 1 OF OPERATION

Figure 3A:
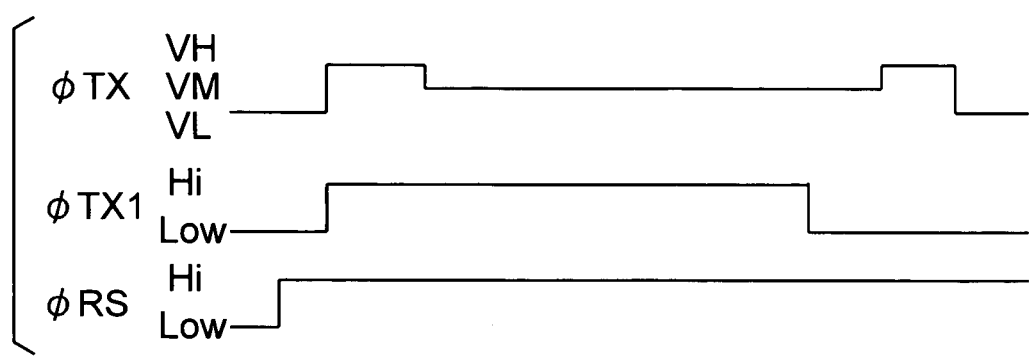
FIGS. 3A and 3B are timing charts showing the states of relevant signals to illustrate an example of operation in the pixel shown in FIG. 2.
Figure 3B:
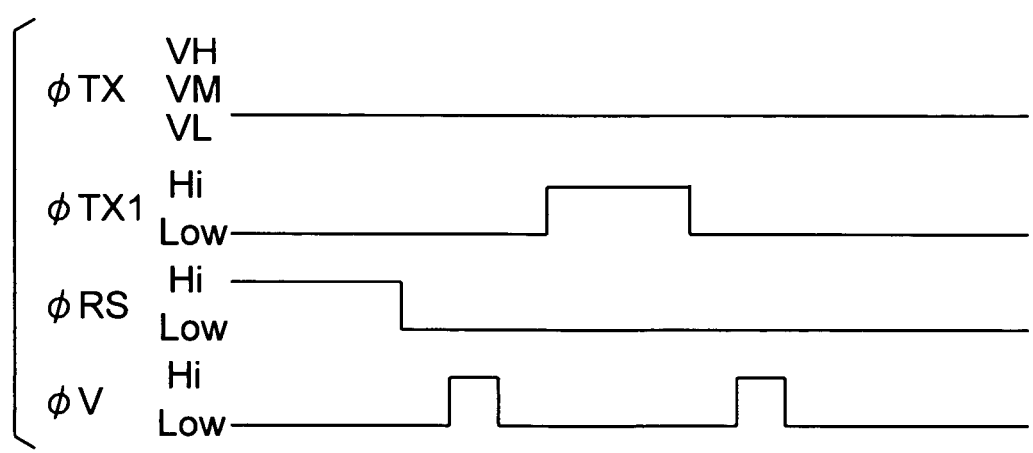

An example of the operation of the solid-state image-sensing device provided with pixels G11 to Gmn configured as shown in FIG. 2 will be described below with reference to the relevant drawings. FIGS. 3A and 3B are timing charts showing the behavior of the signals fed to each pixel in this example of operation. FIGS. 4A to 4C, 5A to 5C, 6A to 6C, 7A, and 7B show the potential states of individual channels in the pixel as observed when the pixel operates according to the timing charts shown in FIGS. 3A and 3B.

In this example of operation, the signal φTX fed to the transfer gate TG is switched among three different voltage levels, namely VH, VM, and VL (VH>VM>VL). By properly setting the voltage level VM of the signal φTX, it is possible to make the MOS transistor T1 operate in a subthreshold region when the amount of photoelectric charge produced by the buried photodiode PD is larger than a particular value. This makes it possible to switch photoelectric conversion between linear conversion and logarithmic conversion according to the amount of incident light. Moreover, by varying the voltage level VM of the signal φTX, it is possible to vary the inflection point across which the photoelectric conversion by the buried photodiode PD and the MOS transistor T1 is switched from linear to logarithmic conversion and vice versa. Now, the operation of the pixels in the solid-state image-sensing device in this example will be described.

With respect to the pixels G11 to Gmn of the solid-state image-sensing device, first the behavior of the signals as observed when image sensing is performed according to FIG. 3A simultaneously in all the pixels during a vertical blanking interval will be described. Here, the levels of the signals φRS, φTX, and φTX1 are switched as shown in FIG. 3A with the same timing for all the pixels constituting the solid-state image-sensing device. First, the voltage level of the signal φTX is turned to VL, and the signals φTX1 and φRS are turned low, so that the MOS transistors T1 to T3 are off. Then, the signal φRS is turned high, so that the MOS transistor T3 is on.

Figure 4A:
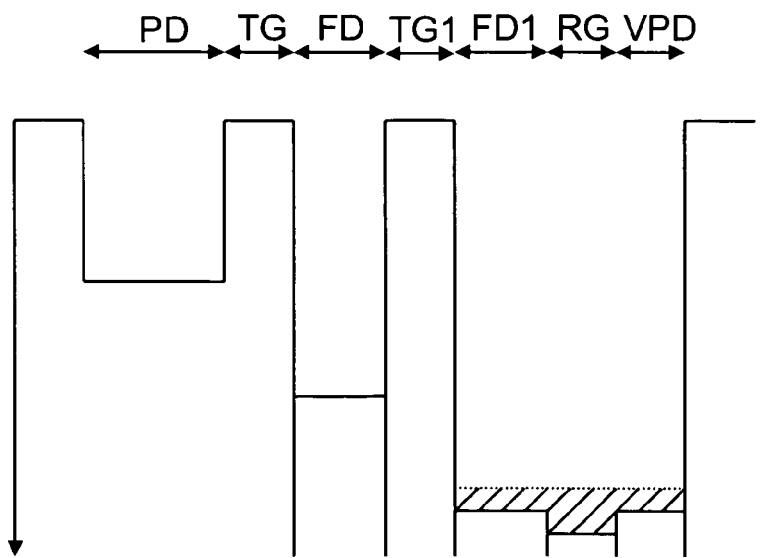
FIGS. 4A to 4C are diagrams showing the potential states of individual channels in the pixel shown in FIG. 2.

This makes the potential at the sub-gate region, called the reset gate RG, of the MOS transistor T2 low as shown in FIG. 4A.

Figure 4B:
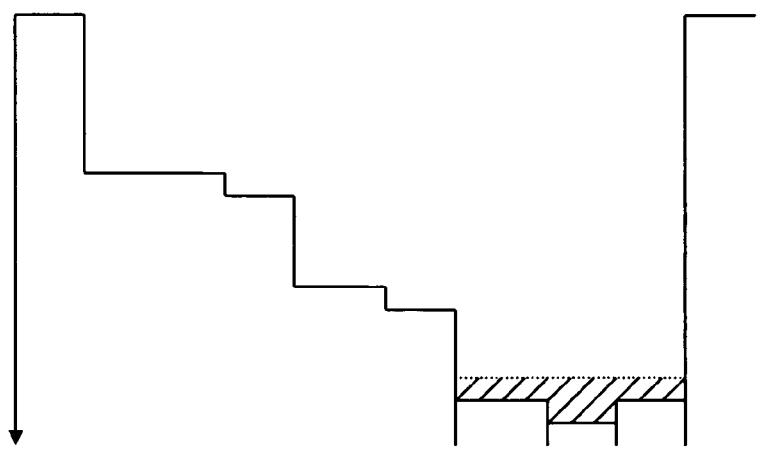
Figure 4C:
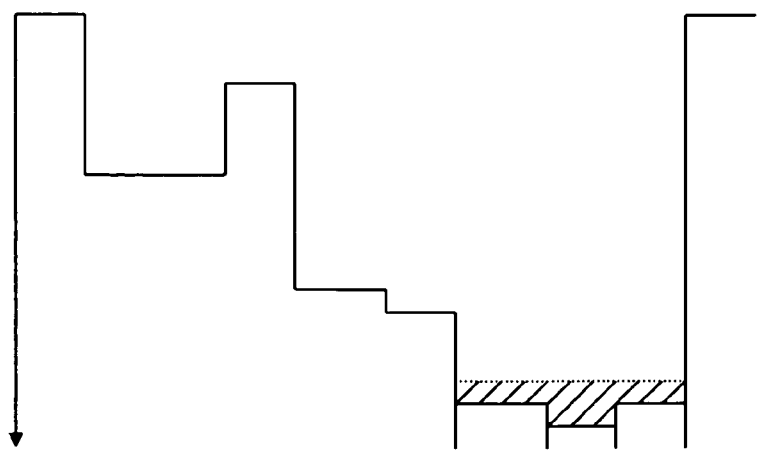

Subsequently, the voltage level of the signal φTX is turned to VH, and the signal φTX1 is turned high, so that the MOS transistors T1 and T2 are on. This makes also the potentials at the transfer gates TG and TG1 low as shown in FIG. 4B. Thus, the potentials at the buried photodiode PD and the N-type floating diffusion regions FD and FD1 are initialized. After the N-type floating diffusion regions FD and FD1 and the buried photodiode PD are individually initialized in this way, the voltage level of the signal φTX is turned to VM, so that the potential states of the buried photodiode PD, the N-type floating diffusion regions FD and FD1, the transfer gates TG and TG1, and the reset gate RG have a relationship as shown in FIG. 4C. Now, exposure is started in the buried photodiode PD.

Figure 5A:
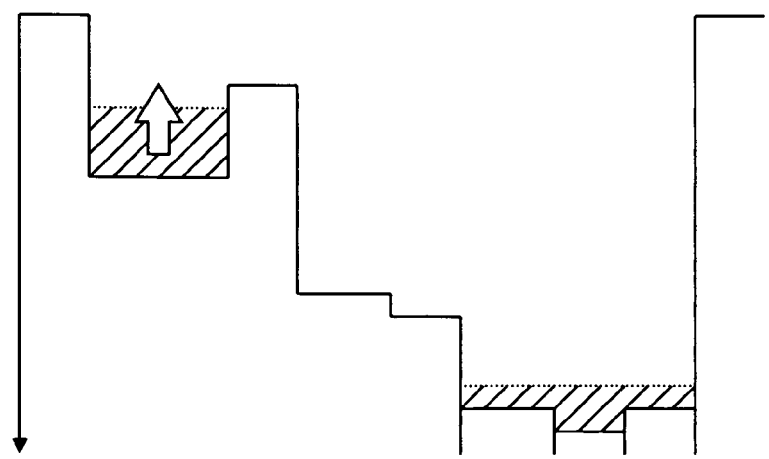
FIGS. 5A to 5C are diagrams showing the potential states of individual channels in the pixel shown in FIG. 2.
Figure 5B:
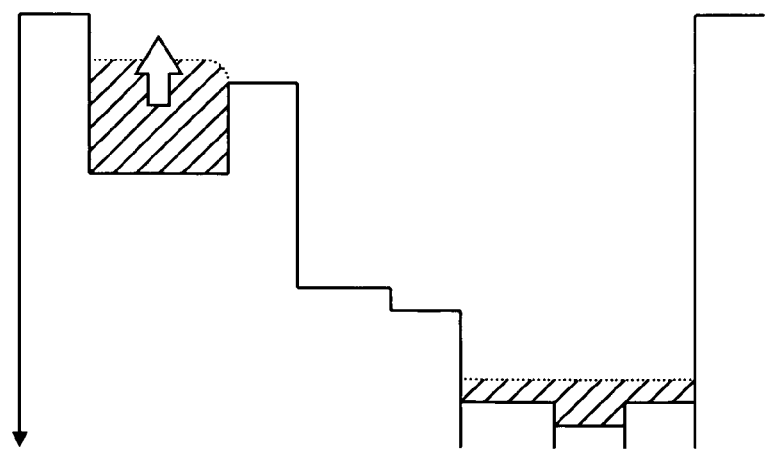

When exposure is started and light is incident on the buried photodiode PD, a photoelectric charge commensurate with the amount of incident light is produced, and is accumulated in the buried photodiode PD, changing the potential at the buried photodiode PD. Here, if the brightness of the subject is low, the photoelectric charge is accumulated in the buried photodiode PD, and the charge at the buried photodiode PD varies linearly with respect to the integral of the amount of incident light as shown in FIG. 5A. By contrast, if the brightness of the subject is high, the potential at the buried photodiode PD is so high that its difference from the potential at the transfer gate TG is close to the threshold value as shown in FIG. 5B. Thus, the MOS transistor T1, which includes the transfer gate TG, operates in a subthreshold region, permitting a current to flow. Thus, the potential at the buried photodiode PD varies in proportion to the logarithm of the current resulting from photoelectric conversion.

Figure 5C:
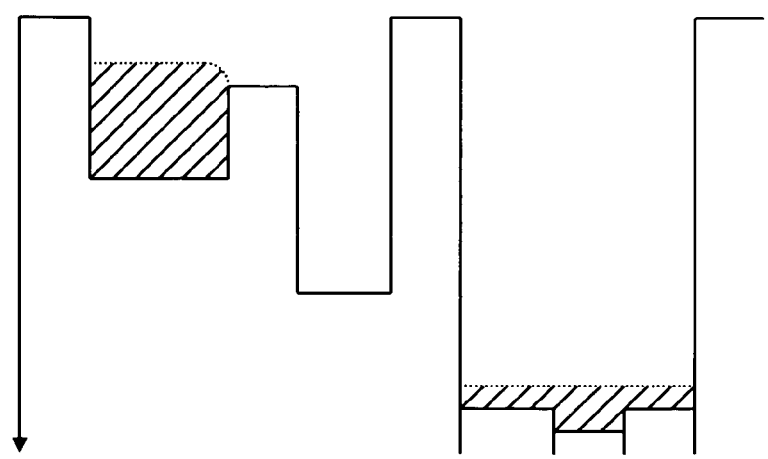
Figure 6A:
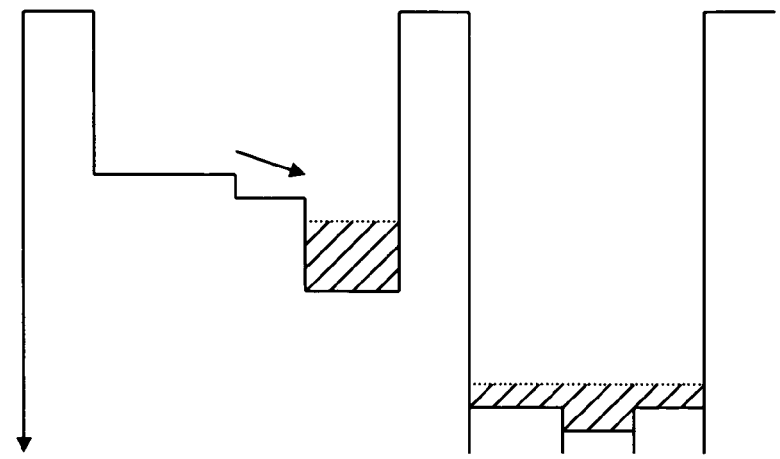
FIGS. 6A to 6C are diagrams showing the potential states of individual channels in the pixel shown in FIG. 2.

Subsequently, the signal φTX1 is turned low to turn MOS transistor T2 off, so that the potential at the transfer gate TG1 is high as shown in FIG. 5C. Then, the voltage level of the signal φTX is turned to VH to turn the MOS transistor T1 on, so that the potential at the transfer gate TG is low. By changing the potential states of the transfer gates TG and TG1 in this way, the photoelectric charge produced in the buried photodiode PD is transferred to the N-type floating diffusion region FD, so that the potential at the N-type floating diffusion region FD is commensurate with the amount of incident light as shown in FIG. 6A.

Figure 6B:
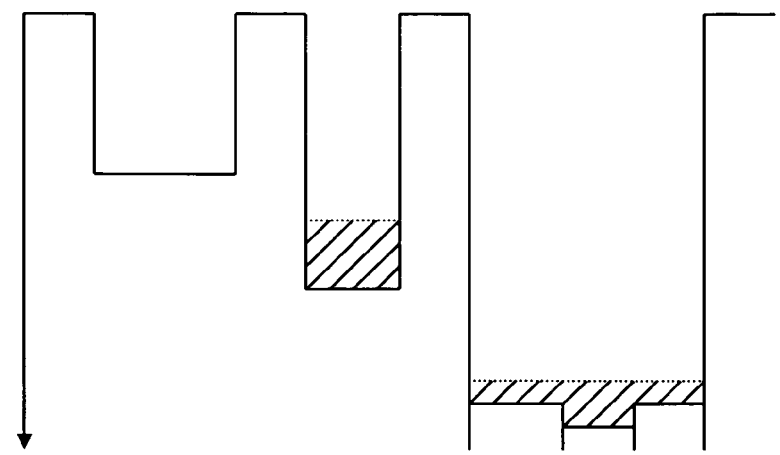

Subsequently, the voltage level of the signal φTX is turned to VL to turn the MOS transistor T1 off, so that the potential at the transfer gate TG is high as shown in FIG. 6B. This causes the charge, commensurate with the amount of incident light, transferred from the buried photodiode PD to be held in the N-type floating diffusion region FD. As a result of the pixels G11 to Gmn individually operating as described above simultaneously, in each of the pixels G11 to Gmn simultaneously, the charge commensurate with the amount of light incident on the buried photodiode PD is held in the N-type floating diffusion region FD.

Figure 6C:
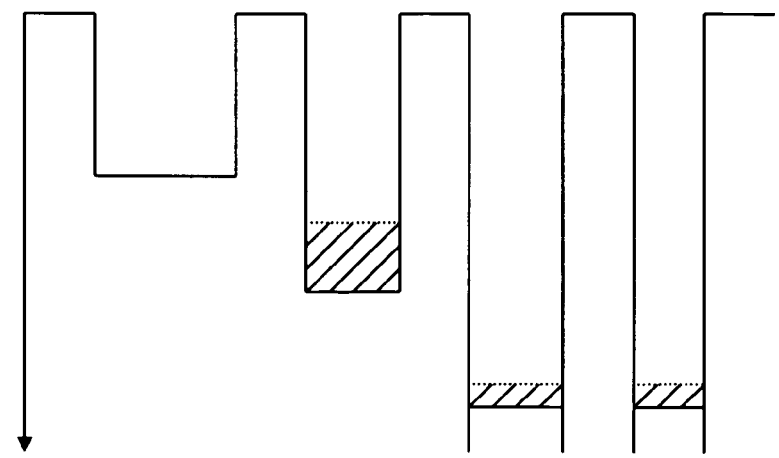

On completion of the image sensing in all the pixels G11 to Gmn during this vertical blanking interval, in each of the pixels G11 to Gmn, the charge commensurate with the amount of incident light is held in the N-type floating diffusion region FD. Now, the levels of the signals φTX1, φRS, and φV, which are fed to one row after another of the solid-state image-sensing device, are switched as shown in FIG. 3B every horizontal blanking period, so that image signals and noise signals are sequentially outputted row-by-row. While the image signals and the noise signals are read out here, the voltage level of the signal φTX remains at VL. Meanwhile, first, the signal φRS is turned from high to low, and the MOS transistor T3 is turned off, so that the potential at the reset gate RG is high as shown in FIG. 6C.

Then, a high pulse signal is fed as the signal φV to the gate of the MOS transistor T5 to turn the MOS transistor T5 on, so that the reset level of the N-type floating diffusion region FD1 is fed to the gate of the MOS transistor T4. Thus, the MOS transistor T4, which together with the constant current source 6 (corresponding to the constant current sources 6-1 to 6-m shown in FIG. 1) constitutes a source follower circuit, outputs, as a noise signal, a voltage signal commensurate with the reset level of the N-type floating diffusion region FD1.

Figure 7A:
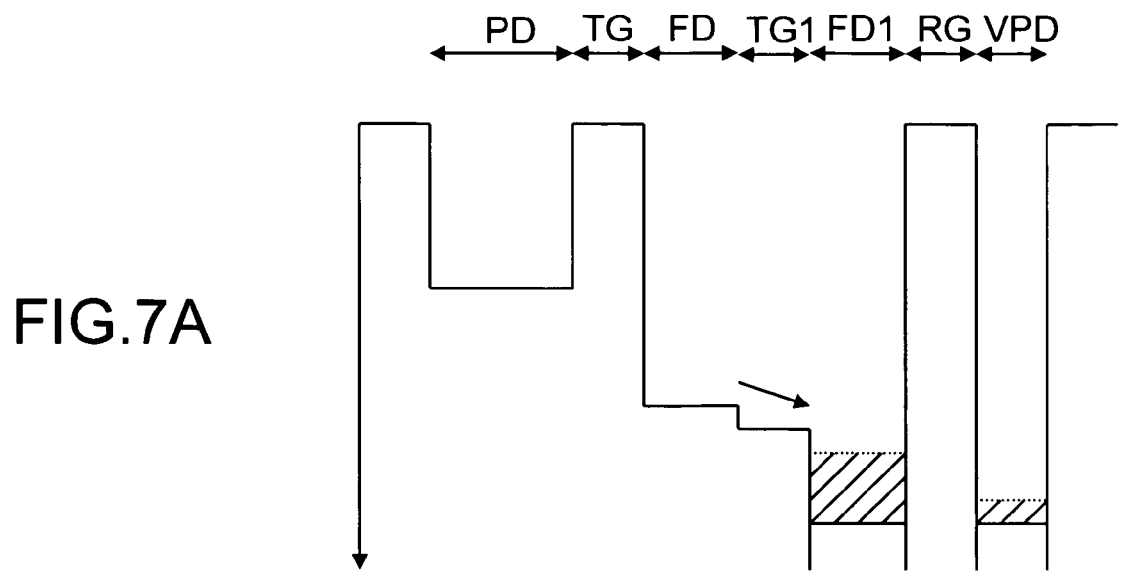
FIGS. 7A and 7B are diagrams showing the potential states of individual channels in the pixel shown in FIG. 2.
Figure 7B:
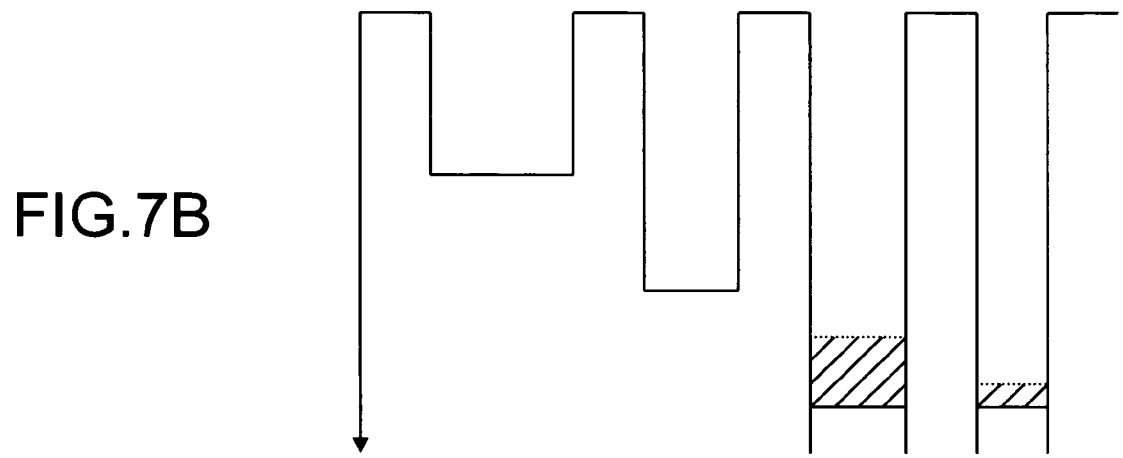

Subsequently, the signal φTX1 is turned high to turn the MOS transistor T2 on, so that the potential of the transfer gate TG1 is low as shown in FIG. 7A. This permits the photoelectric charge accumulated in the N-type floating diffusion region FD to be transferred to the N-type floating diffusion region FD1. Then, the signal φTX1 is turned low to turn the MOS transistor T2 off, so that the potential at the transfer gate TG1 is high as shown in FIG. 7B. This permits the charge commensurate with the amount of incident light to be held in the N-type floating diffusion region FD1.

Then, a high pulse signal is fed as the signal φV to the gate of the MOS transistor T5 to turn the MOS transistor T5 on, so that a voltage based on the charge, commensurate with the amount of incident light, held in the N-type floating diffusion region FD is fed to the gate of the MOS transistor T4. Thus, the MOS transistor T4, which together with the constant current source 6 constitutes a source follower circuit, outputs, as an image signal, a voltage signal commensurate with the amount of incident light.

EXAMPLE 2 OF OPERATION

Figure 8A:
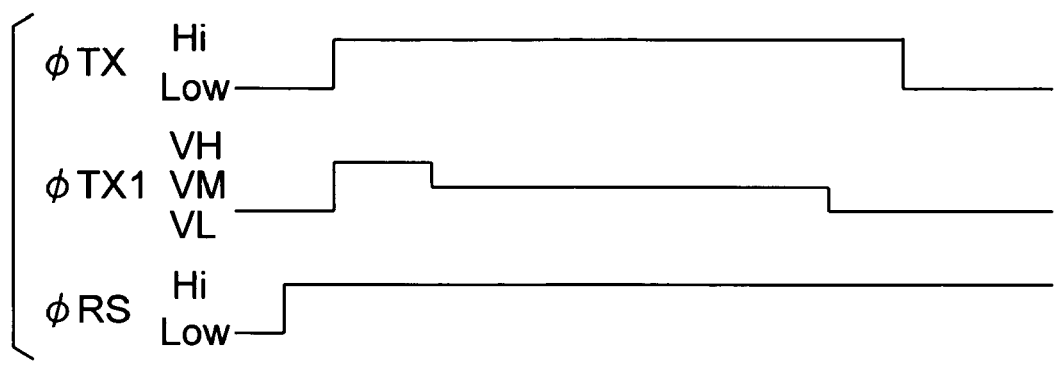
FIGS. 8A and 8B are timing charts showing the states of relevant signals to illustrate another example of operation in the pixel shown in FIG. 2.
Figure 8B:
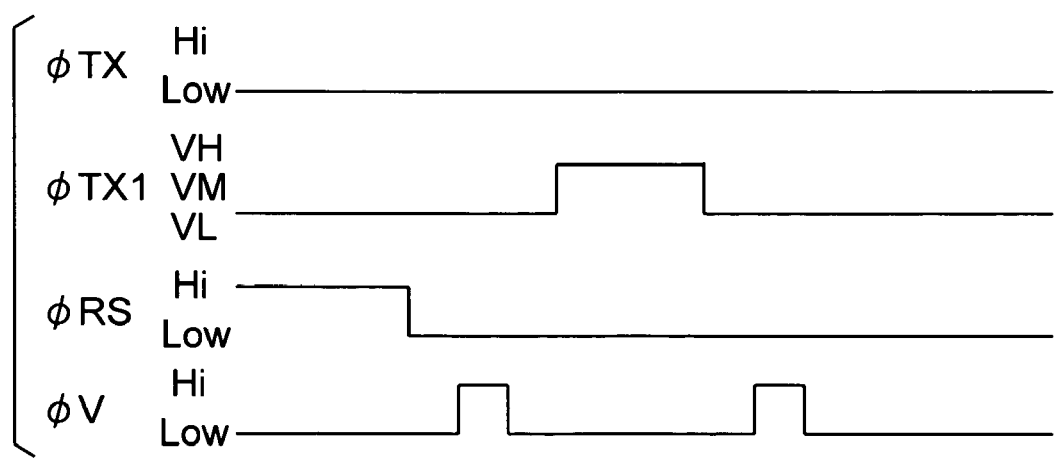

Another example of the operation of pixels G11 to Gmn configured as shown in FIG. 2 will be described below with reference to the relevant drawings. FIGS. 8A and 8B are timing charts showing the behavior of the signals fed to each pixel in this example of operation. FIGS. 9A to 9C and 10A to 10C show the potential states of individual channels in the pixel as observed when the pixel operates according to the timing charts shown in FIGS. 8A and 8B.

This example of operation differs from example 1 of operation in: that the signal φTX1 fed to the transfer gate TG1 is switched among three different voltage levels, namely VH, VM, and VL (VH>VM>VL); and that the signal φTX is switched between two levels, namely a high or a low level. By properly setting the voltage level VM of the signal φTX1, it is possible to make the MOS transistor T2 operate in a subthreshold region when the amount of photoelectric charge produced by the buried photodiode PD is larger than a particular value. This makes it possible to switch photoelectric conversion between linear conversion and logarithmic conversion according to the amount of incident light. Moreover, by varying the voltage level VM of the signal φTX1, it is possible to vary the inflection point across which the photoelectric conversion by the buried photodiode PD and the MOS transistor T2 is switched from linear to logarithmic conversion and vice versa. Now, the operation of the pixels in the solid-state image-sensing device in this example will be described.

With respect to the pixels G11 to Gmn of the solid-state image-sensing device, first the behavior of the signals as observed when image sensing is performed according to FIG.

Figure 9A:
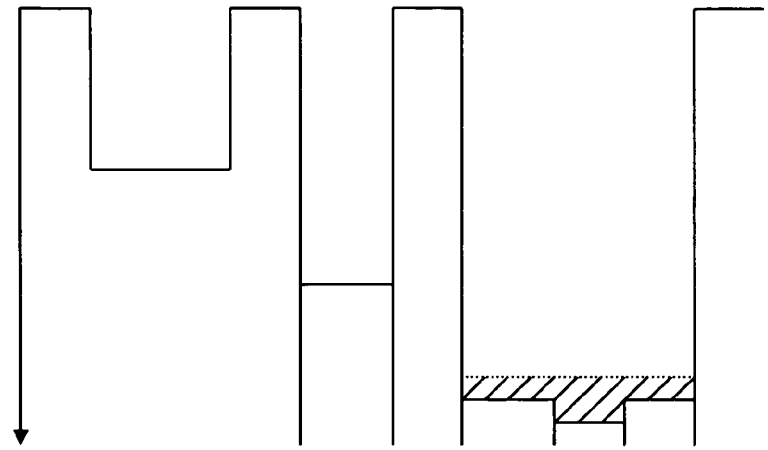
FIGS. 9A to 9C are diagrams showing the potential states of individual channels in the pixel shown in FIG. 2.

8A simultaneously in all the pixels during a vertical blanking interval will be described. Here, the levels of the signals φRS, φTX, and φTX1 are switched as shown in FIG. 8A with the same timing for all the pixels constituting the solid-state image-sensing device. First, the voltage level of the signal φTX1 is turned to VL, and the signals φTX and φRS are turned low, so that the MOS transistors T1 to T3 are off. Then, the signal φRS is turned high, so that the MOS transistor T3 is on. This makes the potential at the sub-gate region, called the reset gate RG, of the MOS transistor T2 low as shown in FIG. 9A.

Figure 9B:
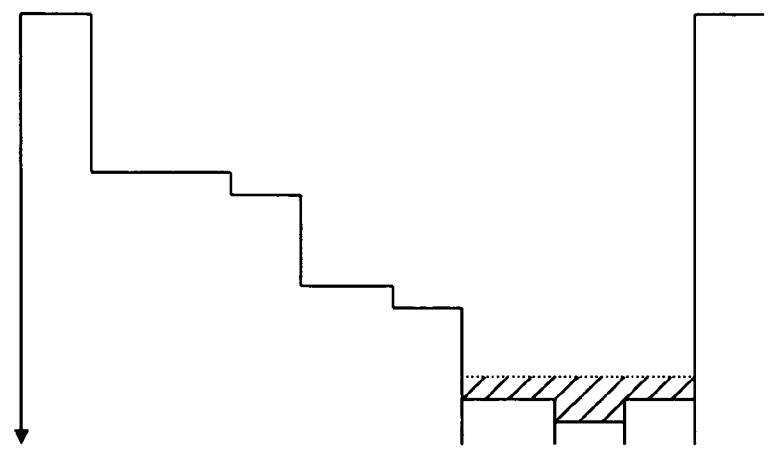
Figure 9C:
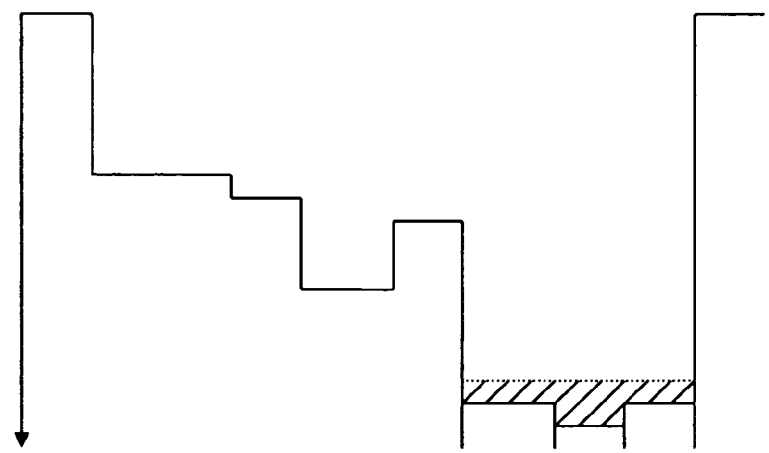

Subsequently, the signal φTX is turned high, and the voltage level of the signal φTX1 is turned to VH, so that the MOS transistors T1 and T2 are on. This makes the potentials at the transfer gates TG and TG1 low as shown in FIG. 9B. Thus, the potentials at the buried photodiode PD and the N-type floating diffusion regions FD and FD1 are initialized. Then, the voltage level of the signal φTX1 is turned to VM to establish potential states as shown in FIG. 9C that permit the buried photodiode PD and the MOS transistors T1 and T2 to perform photoelectric conversion. Now, exposure is started in the buried photodiode PD.

Figure 10A:
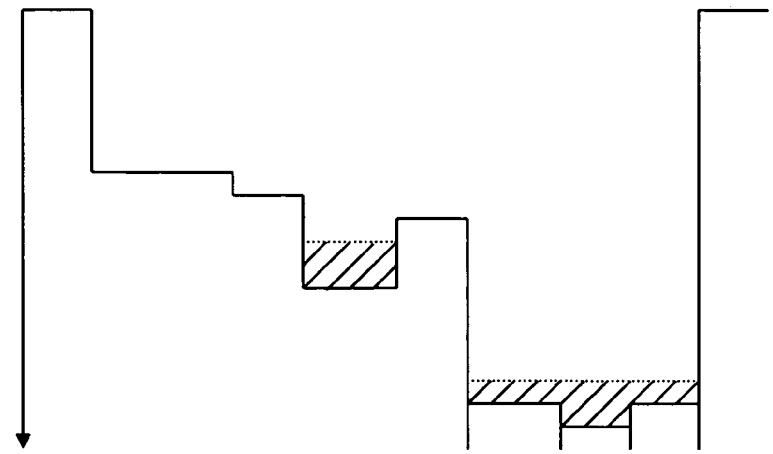
FIGS. 10A to 10C are diagrams showing the potential states of individual channels in the pixel shown in FIG. 2.
Figure 10B:
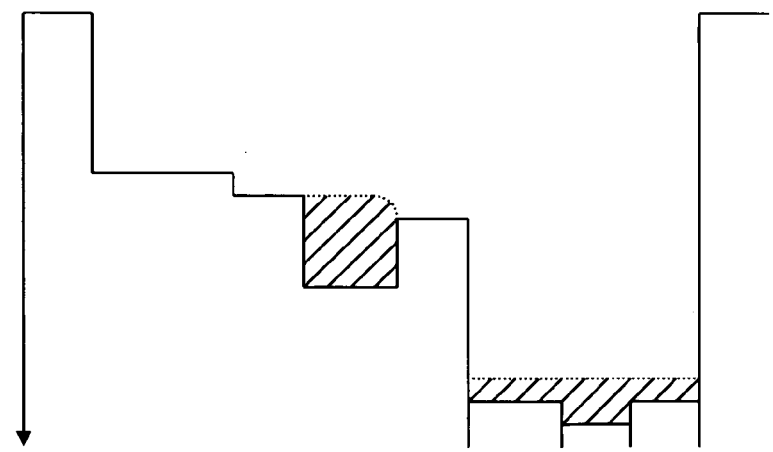

When exposure is started and light is incident on the buried photodiode PD, a photoelectric charge commensurate with the amount of incident light is produced, and the produced photoelectric charge flows via the transfer gate TG into the N-type floating diffusion region FD. The photoelectric charge is accumulated in the N-type floating diffusion region FD, and thus changes the potential at the N-type floating diffusion region FD. Here, if the brightness of the subject is low, the photoelectric charge is accumulated in the N-type floating diffusion region FD, and the charge at the N-type floating diffusion region FD varies linearly with respect to the integral of the amount of incident light as shown in FIG. 10A. By contrast, if the brightness of the subject is high, the potential at the N-type floating diffusion region FD is so high that its difference from the potential at the transfer gate TG1 is close to the threshold value as shown in FIG. 10B. Thus, a sub-threshold current flows through the MOS transistor T2, which includes the transfer gate TG1, and the potential at the N-type floating diffusion region FD varies in proportion to the logarithm of the current resulting from photoelectric conversion.

Figure 10C:
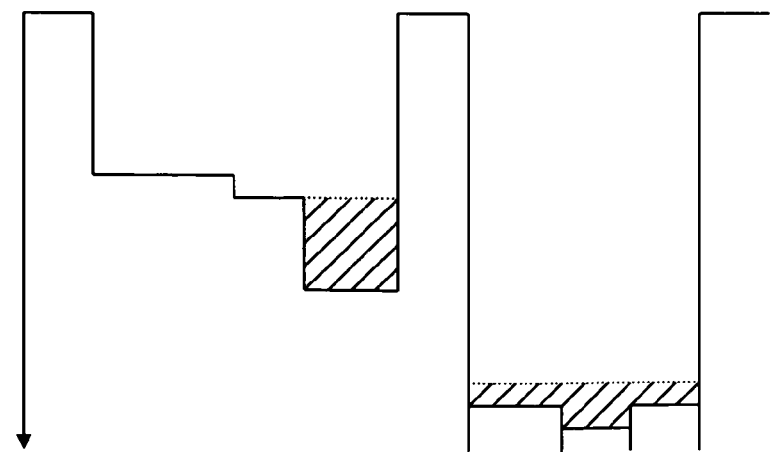

Subsequently, first, the voltage level of the signal φTX1 is turned to VL to turn MOS transistor T2 off, so that the potential at the transfer gate TG1 is high as shown in FIG. 10C. This prevents the photoelectric charge from flowing into the N-type floating diffusion region FD1. Then, the signal φTX is turned low to turn the MOS transistor T1 off, so that the potential at the transfer gate TG is high. This prevents the photoelectric charge from the buried photodiode PD from flowing into the N-type floating diffusion region FD. In this way, as in example 1 of operation, the charge, commensurate with the amount of incident light, at the N-type floating diffusion region FD is held. As a result of the pixels G11 to Gmn individually operating as described above simultaneously, in each of the pixels G11 to Gmn simultaneously, the charge commensurate with the amount of light incident on the buried photodiode PD is held in the N-type floating diffusion region FD.

On completion of the image sensing in all the pixels G11 to Gmn during this vertical blanking interval, in each of the pixels G11 to Gmn, the charge commensurate with the amount of incident light is held in the N-type floating diffusion region FD. Now, the levels of the signals φTX1, φRS, and φV, which are fed to one row after another of the solid-state image-sensing device, are switched as shown in FIG. 8B every horizontal blanking period, so that image signals and noise signals are sequentially outputted row-by-row. While the image signals and the noise signals are read out here, the signal φTX remains low. Meanwhile, the levels of the signals φTX1, φRS, and φV are switched with the same timing as in example 1 of operation.

Specifically, first, the signal φRS is turned from high to low, so that the potential at the reset gate RG is high as shown in FIG. 6C. Then, a high pulse signal is fed as the signal φV to turn the MOS transistor T5 on, so that, as a noise signal, a voltage signal commensurate with the reset level of the N-type floating diffusion region FD1 is outputted. Subsequently, the signal φTX1 is turned to VH, so that the potential at the transfer gate TG1 is low as shown in FIG. 7A. This permits the charge held in the N-type floating diffusion region FD to be transferred to the N-type floating diffusion region FD1. Then, the signal φTX1 is turned to VL, so that the potential at the transfer gate TG1 is high as shown in FIG. 7B. This permits a charge commensurate with the amount of incident light to be held in the N-type floating diffusion region FD1. Then, a high pulse signal is fed as the signal φV to turn the MOS transistor T5 on, so that, as an image signal, a voltage signal commensurate with the amount of incident light is outputted.

In this way, in either example of operation described above, the charge obtained through photoelectric conversion by the buried photodiode PD during image sensing by global shuttering is held in the N-type floating diffusion region FD. Then, during reading of one row after another, a noise signal based on the reset level of the N-type floating diffusion region FD1 in its reset state is outputted, and then the charge held in the N-type floating diffusion region FD is transferred to the N-type floating diffusion region FD1 so that an image signal commensurate with the transferred charge is outputted. Thus, by correcting the image signal according to the noise signal in the correction circuit 8 provided in the succeeding stage, it is possible to eliminate kTC noise.

In the embodiments described above, the MOS transistors T1 to T5 are all N-channel MOS transistors. In a case where the MOS transistors T1 to T5 are all N-channel MOS transistors in this way, they are formed in a P-type well layer or in a P-type substrate.

In the embodiments described above, while the MOS transistors T1 to 3 are formed as N-channel MOS transistors, the MOS transistors T4 and T5 may be formed as P-channel MOS transistors. In this case, the MOS transistors T4 and T5 formed as P-channel MOS transistors may be formed in an N well layer. Moreover, in this case, the direct-current voltage VPS is applied to the drain of the MOS transistor T4 formed as a P-channel MOS transistor.

What is claimed is:

1. A solid-state image-sensing device comprising a plurality of pixels, the pixels each comprising:
a buried photodiode that produces a photoelectric charge commensurate with an amount of incident light and that accumulates the photoelectric charge within itself;
a first transfer gate that transfers the photoelectric charge accumulated in the buried photodiode;
a first floating diffusion region that accumulates an electric charge transferred via the first transfer gate from the buried photodiode;
a second transfer gate that transfers the electric charge accumulated in the first floating diffusion region; and
a second floating diffusion region that accumulates an electric charge transferred via the second transfer gate from the first floating diffusion region, wherein, in each pixel, the buried photodiode, the first and second transfer gates, and the first floating diffusion region together constitute a photoelectric conversion portion, and wherein, as a result of all the pixels performing image sensing simultaneously in the respective photoelectric conversion portions, simultaneously in each of the pixels, the photoelectric charge commensurate with the amount of light incident on the buried photodiode is held in the first floating diffusion region, then, in each pixel, a noise signal commensurate with an initial state of the second floating region is outputted, and then the photoelectric charge held in the first floating diffusion region is transferred to the second floating diffusion region, and an image signal commensurate with an amount of the thus transferred photoelectric charge is outputted.

2. The solid-state image-sensing device of claim 1, wherein, when the photoelectric conversion portion performs image sensing, first the photoelectric charge produced in the buried photodiode is accumulated in the buried photodiode itself, then the accumulated photoelectric charge is transferred via the first transfer gate to the first floating diffusion region, and then the transferred photoelectric charge is held in the first floating diffusion region.

3. The solid-state image-sensing device of claim 2, wherein a voltage fed to the first transfer gate has one of a first voltage level that keeps the first transfer gate in a conducting state, a second voltage level that keeps the first transfer gate in a non-conducting state, and a third voltage level intermediate between the first and second voltage level, and when the photoelectric conversion portion performs image sensing, first the second transfer gate is brought into a conducting state and the voltage fed to the first transfer gate is turned to the third voltage level so that, in at least part of a brightness range of the light incident on the buried photodiode, a transistor including the first transfer gate and the first floating diffusion region is operated in a subthreshold region to accumulate the photoelectric charge in the buried photodiode, then the second transfer gate is brought into a non-conducting state and the voltage fed to the first transfer gate is turned to the first voltage level so that the photoelectric charge accumulated in the buried photodiode is transferred to the first floating diffusion region, and then the voltage fed to the first transfer gate is turned to the second voltage level so that the photoelectric charge transferred to the first floating diffusion region is held there.

4. The solid-state image-sensing device of claim 1, wherein, when the photoelectric conversion portion performs image sensing, first the first transfer gate is brought into a conducting state to permit the photoelectric charge produced in the buried photodiode to flow into the first floating diffusion region so as to be accumulated in the first floating diffusion region, and then the accumulated electric charge is held in the first floating diffusion region.

5. The solid-state image-sensing device of claim 4, wherein a voltage fed to the second transfer gate has one of a first voltage level that keeps the second transfer gate in a conducting state, a second voltage level that keeps the second transfer gate in a non-conducting state, and a third voltage level intermediate between the first and second voltage level, and when the photoelectric conversion portion performs image sensing, first the first transfer gate is brought into a conducting state and the voltage fed to the second transfer gate is turned to the third voltage level so that, in at least part of a brightness range of the light incident on the buried photodiode, a transistor including the second transfer gate and the first and second floating diffusion regions is operated in a subthreshold region to accumulate an electric charge in the first floating diffusion region, and then the first transfer gate is brought into a non-conducting state and the voltage fed to the second transfer gate is turned to the second voltage level so that the electric charge accumulated in the first floating diffusion region is held there.

6. The solid-state image-sensing device of claim 1, wherein the pixels each further comprise:

a reset gate that is connected to the second floating diffusion region so as to be used to reset the second floating diffusion region;

an amplifier that is connected to the second floating diffusion region; and a read-out switch for reading out an output signal amplified by the amplifier.

7. The solid-state image-sensing device of claim 6, wherein, by bringing the reset gate and the first and second transfer gates into a conducting state, the first and second floating diffusion regions and the buried photodiode are reset.

8. A solid-state image-sensing device comprising a plurality of pixels, each pixel comprising:

a buried photodiode adapted to produce a photoelectric charge commensurate with an amount of light incident on the buried photodiode, the buried photodiode adapted to accumulate the photoelectric charge within itself;

a first transfer gate including a first gate electrode and a first channel, the first transfer gate adapted to control transfer of an electric charge accumulated in the buried photodiode;

a first floating diffusion region adapted to accumulate the electric charge transferred via the first transfer gate from the buried photodiode;

a second transfer gate including a second gate electrode and a second channel, the second transfer gate adapted to control transfer of the electric charge accumulated in the first floating diffusion region; and a second floating diffusion region adapted to accumulate the electric charge transferred via the second transfer gate from the first floating diffusion region.

9. The solid-state image-sensing device of claim 8, wherein each pixel further comprises:

a reset gate connected to the second floating diffusion region, the reset gate adapted to reset the second floating diffusion region;

an amplifier connected to the second floating diffusion region; and a read-out switch connected to the amplifier, the read-out switch adapted to read out an output signal amplified by the amplifier.

10. A method for imaging with a solid-state image-sensing device comprising a plurality of pixels, each pixel including a buried photodiode, a first floating diffusion region, and a second floating diffusion region, the method comprising the steps of:

outputting respective noise signals commensurate with an initial state of each second floating diffusion region;

accumulating a photoelectric charge within each buried photodiode, the photoelectric charge commensurate with an amount of light incident on each respective buried photodiode;

transferring an electric charge accumulated in each respective buried photodiode to a corresponding first floating diffusion region;

transferring the electric charge from each first floating diffusion region to a corresponding second floating diffusion region; and outputting respective image signals commensurate with the amount of electric charge transferred to each second floating diffusion region.

11. The method of claim 10 further comprising the step of resetting the buried photodiode, the first floating diffusion region, and the second floating diffusion region.

\* \* \* \* \*